(12) United States Patent
Natali et al.

(10) Patent No.: US 10,347,483 B2
(45) Date of Patent: Jul. 9, 2019

(54) RARE EARTH NITRIDE STRUCTURE OR DEVICE AND FABRICATION METHOD

(71) Applicants: Franck Natali, Porirua (NZ); Stéphane Ange Vézian, Grasse (FR); Jay Ross Peng Cheong Chan, Wellington (NZ); Benjamin John Ruck, Lower Hutt (NZ); Harry Joseph Trodahl, Wellington (NZ)

(72) Inventors: Franck Natali, Porirua (NZ); Stéphane Ange Vézian, Grasse (FR); Jay Ross Peng Cheong Chan, Wellington (NZ); Benjamin John Ruck, Lower Hutt (NZ); Harry Joseph Trodahl, Wellington (NZ)

(*) Notice: Subject to any disclaimer, the term of this patent is extended or adjusted under 35 U.S.C. 154(b) by 0 days.

(21) Appl. No.: 15/607,596

(22) Filed: May 29, 2017

(65) Prior Publication Data
US 2018/0339912 A1    Nov. 29, 2018

(51) Int. Cl.
| | | |
|---|---|---|
| *C01F 17/00* | (2006.01) | |
| *G01N 23/20* | (2018.01) | |
| *G01Q 30/02* | (2010.01) | |
| *H01L 21/02* | (2006.01) | |

(52) U.S. Cl.
CPC .... *H01L 21/02516* (2013.01); *H01L 21/0237* (2013.01); *H01L 21/0254* (2013.01); *H01L 21/02381* (2013.01); *H01L 21/02433* (2013.01); *H01L 21/02439* (2013.01); *H01L 21/02458* (2013.01); *H01L 21/02502* (2013.01)

(58) Field of Classification Search
CPC ... H01L 33/007; H01L 33/16; H01L 29/0676; H01L 21/035236; H01L 21/02639; H01L 21/02433; H01L 21/0243; H01L 21/02609; H01L 21/02516; H01L 21/0254; H01L 21/02458; H01L 21/3147; H01L 29/2003; H01L 41/0815; C01P 2002/30; C01P 2002/20; C01F 17/0075; C01F 17/0043
See application file for complete search history.

(56) References Cited

U.S. PATENT DOCUMENTS

| | | | | |
|---|---|---|---|---|
| 2005/0161773 A1* | 7/2005 | Atanackovic | .......... | B82Y 20/00 257/632 |
| 2007/0194300 A1* | 8/2007 | Ibbetson | ............... | H01L 29/205 257/30 |
| 2007/0297969 A1* | 12/2007 | Van Patten | ............ | B82Y 30/00 423/409 |
| 2009/0001329 A1* | 1/2009 | Atanackovic | ....... | H01L 21/3141 252/521.1 |
| 2010/0320474 A1* | 12/2010 | Resler | ................. | G02F 1/13439 257/76 |

(Continued)

OTHER PUBLICATIONS

S. Vezian, et al , Journal of Crystal Growth, 450 (2016) pp. 22-27.*

(Continued)

*Primary Examiner* — Caridad Everhart
(74) *Attorney, Agent, or Firm* — Andre Roland S.A.; Nikolaus Schibli

(57) ABSTRACT

Structure or device comprising a hexagonal crystal layer or hexagonal crystal substrate, and a (001)-oriented rare earth nitride epitaxial layer on the hexagonal crystal layer or hexagonal crystal substrate.

24 Claims, 7 Drawing Sheets

```
                    ┌─ 1

┌─────────────────────────────────┐
│                                 │
│   REN 001 layer           3    │
│                                 │
├─────────────────────────────────┤
│                                 │
│   Substrate or deposition layer  5
│                                 │
└─────────────────────────────────┘
```

(56) References Cited

U.S. PATENT DOCUMENTS

2015/0014676 A1\* 1/2015 Dargis .............. H01L 21/02381
                           257/43
2019/0074365 A1\* 3/2019 Pelzel ............... H01L 21/02123

OTHER PUBLICATIONS

Chan, J.R., Vézian, S., Trodahl, J., Khalfioui, M.A., Damilano, B. and Natali, F., 2016. Temperature-Induced Four-Fold-on-Six-Fold Symmetric Heteroepitaxy, Rocksalt SmN on Hexagonal AlN. Crystal Growth & Design, vol. 16(11), pp. 6454-6460.

Grundmann, Marius. "Formation of epitaxial domains: Unified theory and survey of experimental results." physica status solidi (b) vol. 248.4 (2011), pp. 805-824.

\* cited by examiner

RARE EARTH NITRIDE STRUCTURE OR DEVICE AND FABRICATION METHOD

FIELD OF THE INVENTION

The present invention relates to the field of rare earth structures or devices, and a fabrication method for producing such structures or devices.

DISCUSSION OF THE BACKGROUND ART

Rare earth elements are a set of fifteen chemical elements in the periodic table, consisting of lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu). While named rare earths, they are in fact not that rare and are relatively abundant in the Earth's crust with the exception of promethium, which has no stable nuclear isotope.

The rare earth nitrides (RENs) form in the face-centered cubic (FCC) rocksalt NaCl structure with lattice constants ranging from ~5.3 Å for LaN to ~4.76 Å for LuN, in total a 5% difference across the series and less than 0.5% between nitrides of neighbouring atomic species. There is clearly potential for epitaxial growth of custom-designed heterostructures, including superlattices, and even for controlled strains to be introduced.

Most of the fifteen RENs are intrinsic ferromagnetic semiconductors with magnetic properties that provide interesting contrasts and promising complementary electronic properties that make them genuinely attractive for spintronics applications. The RENs exhibit a wide variety of hard- and soft-ferromagnetic properties, i.e. the series includes members with small and huge coercive fields. The best example is GdN and SmN; GdN has a coercive field as small as ~0.01 Tesla, while in contrast SmN has a coercive field in excess of 6 Tesla.

One of the difficulties which has hindered REN epitaxial growth is the lack of native substrates. A plethora of suitable material that is more or less lattice matched with the RENs has been employed with most research having selected (001) oriented substrate surfaces for REN epitaxy. The resulting REN epitaxial film is fully (001)-oriented, i.e. the (001) direction of the FCC structure of the REN being perpendicular to the surface of the substrate.

The most preferable substrate for REN epitaxy is Yttria-Stabilized Zirconia (YSZ) (001) as it takes an FCC structure, similar to the RENs, with a lattice parameter of 5.125 Å, nearly matching all the REN series.

Historically, the first epitaxial growths of RENs, CeN and then GdN, have been performed on a MgO (001) substrate; but at this time it has been observed that thick films could lead to very rough surfaces.

There are currently broad investigations on combining the rare-earth nitride with group III-nitrides (GaN, AlN, InN) and its alloys, a technologically important non-magnetic semiconductor family used for the fabrication of white and blue light emitting diodes (LEDs) and high power high frequency electronics. This approach aims at taking the best characteristics of both materials and thus lays the foundation for the development of a sustainable technological platform for semiconductor-based spintronics and electronics. Proof of concept devices by combining both materials have already been obtained such as a field effect transistor and GaN-based light emitting diodes with enhanced efficiency.

Group III-nitrides crystallize in either the cubic zinc blende or hexagonal wurtzite structure. Under ambient conditions, the thermodynamically stable structure is the hexagonal wurtzite structure, and commercially available devices such as blue and white LEDs have also a hexagonal wurtzite structure. The wurtzite crystal structure is a member of the hexagonal crystal system or family. Its space group is P63mc in Hermann-Mauguin notation or No. 186 (in the International Union of Crystallography classification).

When REN thin films are epitaxially grown on a hexagonal (0001) wurtzite surface of a group-III nitride, the resulting REN epitaxial film is fully (111)-oriented, i.e. the (111) direction of the FCC structure of the REN layer is perpendicular to the surface of the substrate.

It is not currently possible to grow fully (001) epitaxial layers of RENs on a hexagonal (0001) wurtzite surface of group-III nitrides.

In fact, it is generally extremely rare in materials science to grow a fully oriented (001) rocksalt epilayer on a hexagonal substrate or surface. The extreme difficulty in preparing a fully (001) oriented domain arises from epitaxial relationships and energetic considerations between the epilayer and the substrate that favor the growth in a preferential (111) orientation, where each (111) plane contains one kind of atoms only disposed in a hexagonal mesh.

SUMMARY

It is therefore one aspect of the present disclosure to provide a structure or device that overcomes the above challenges. The structure or device comprises a hexagonal crystal layer or hexagonal crystal substrate, and a (001)-oriented rare earth nitride epitaxial layer on the hexagonal crystal layer or hexagonal crystal substrate.

According to another aspect of the present disclosure, the (001)-oriented rare earth nitride epitaxial layer is in direct contact with a hexagonal crystal surface of the hexagonal crystal layer or hexagonal crystal substrate.

According to still another aspect of the present disclosure, the hexagonal crystal layer or hexagonal crystal substrate has a hexagonal net with a six-fold symmetry.

According to yet another aspect of the present disclosure, the hexagonal crystal layer or hexagonal crystal substrate has a hexagonal wurtzite structure.

According to another aspect of the present disclosure, the hexagonal crystal layer is a hexagonal group III-nitride crystal layer or the hexagonal crystal substrate is a group III-nitride hexagonal crystal substrate.

According to still another aspect of the present disclosure, the (001)-oriented rare earth nitride epitaxial layer is a fully (001) oriented epitaxial layer.

According to yet another aspect of the present disclosure, the (001)-oriented rare earth nitride epitaxial layer consists solely of a fully (001) oriented epitaxial layer.

According to another aspect of the present disclosure, the structure or device further includes a (111)-oriented rare earth nitride epitaxial layer.

According to still another aspect of the present disclosure, the (111)-oriented rare earth nitride epitaxial layer is located on the (001)-oriented rare earth nitride epitaxial layer.

According to another aspect of the present disclosure, the structure or device further includes at least one group III-nitride epitaxial layer on the (111)-oriented rare earth nitride epitaxial layer.

According to yet another aspect of the present disclosure, the structure or device further includes a capping for passivating the rare earth nitride epitaxial layer.

According to still another aspect of the present disclosure, the rare earth nitride epitaxial layer includes or consists of a rare earth nitride selected from the following group: lanthanum nitride (LaN), cerium nitride (CeN), praseodymium nitride (PrN), neodymium nitride (NdN), samarium nitride (SmN), europium nitride (EuN), gadolinium nitride (GdN), terbium nitride (TbN), dysprosium nitride (DyN), holmium nitride (HoN), erbium nitride (ErN), thulium nitride (TmN), ytterbium nitride (YbN), lutetium nitride (LuN).

According to still another aspect of the present disclosure, the rare earth nitride epitaxial layer includes or consists of a rare earth nitride alloy of any two or more of the rare earth nitrides selected from the following group: lanthanum nitride (LaN), cerium nitride (CeN), praseodymium nitride (PrN), neodymium nitride (NdN), samarium nitride (SmN), europium nitride (EuN), gadolinium nitride (GdN), terbium nitride (TbN), dysprosium nitride (DyN), holmium nitride (HoN), erbium nitride (ErN), thulium nitride (TmN), ytterbium nitride (YbN), lutetium nitride (LuN).

According to yet another aspect of the present disclosure, the rare earth nitride epitaxial layer is doped with at least one element that is beryllium, magnesium, calcium, strontium, barium or radium.

According to another aspect of the present disclosure, the structure or device further includes at least one additional rare earth nitride epitaxial layer or multiple successive rare earth nitride epitaxial layers, the at least one additional rare earth nitride epitaxial layer or multiple successive rare earth nitride epitaxial layers comprising or consisting of a rare earth nitride and/or an alloy of rare earth nitrides.

According to still another aspect of the present disclosure, the structure or device further includes at least one additional optical or electrical active hexagonal crystal layer located between the hexagonal crystal layer or hexagonal crystal substrate and the (001)-oriented rare earth nitride epitaxial layer; or at least one additional optical or electrical active layer located on the (001)-oriented rare earth nitride epitaxial layer.

According to yet another aspect of the present disclosure, the at least one additional optical or electrical active layer is located on the (001)-oriented rare earth nitride epitaxial layer and is a group III-nitride layer.

According to another aspect of the present disclosure, the hexagonal crystal layer is a (0001)-oriented layer or the hexagonal crystal substrate is a (0001)-oriented hexagonal substrate.

According to another aspect of the present disclosure, the hexagonal crystal layer or the hexagonal crystal substrate includes or consists of GaN, AlN, InN, or any alloys thereof, or $Al_2O_3$, or ZnO, or $Zn_xMg_{1-x}O$ with x ranging from 1 to 0.4.

According to still another aspect of the present disclosure, the hexagonal crystal layer or hexagonal crystal substrate is AlN and the (001)-oriented rare earth nitride epitaxial layer is SmN.

It is yet another aspect of the present disclosure to provide a method for producing a rare earth nitride structure or rare earth nitride device. The method preferably includes the steps of:
providing a hexagonal crystal layer or a hexagonal crystal substrate; and
depositing a rare earth nitride epitaxial layer on the hexagonal crystal layer or hexagonal crystal substrate at a substrate deposition temperature 175° C. to 225° C. above an evaporation or sublimation temperature of the rare earth material to form a (001) oriented rare earth nitride epitaxial layer.

According to another aspect of the present disclosure, the step of depositing a rare earth nitride epitaxial layer on the hexagonal crystal layer or hexagonal crystal substrate is carried out at a deposition temperature of 225° C. above an evaporation or sublimation temperature of the rare earth material to form a fully (001) oriented rare earth nitride epitaxial layer.

According to still another aspect of the present disclosure, the step of depositing a rare earth nitride epitaxial layer on the hexagonal crystal layer or hexagonal crystal substrate is carried out at a beam equivalent pressure (BEP) of the atomic or molecular beam from an ammonia gas nitrogen precursor of $10 \times 10^{-5}$ to $1 \times 10^{-5}$ Torr.

It is yet another aspect of the present disclosure to provide a structure or device comprising a cubic crystal layer oriented along a (111) direction or a cubic crystal substrate oriented along a (111) direction, and a (001)-oriented rare earth nitride epitaxial layer on the cubic crystal layer oriented along the (111) direction or the cubic crystal substrate oriented along the (111) direction.

The above and other objects, features and advantages of the present invention and the manner of realizing them will become more apparent, and the invention itself will best be understood from a study of the following description with reference to the attached drawings showing some preferred embodiments of the invention.

BRIEF DESCRIPTION OF THE SEVERAL VIEWS OF THE DRAWINGS

Herein, identical reference numerals are used, where possible, to designate identical elements that are common to the figures.

DETAILED DESCRIPTION OF SEVERAL EMBODIMENTS

Figure 1A:
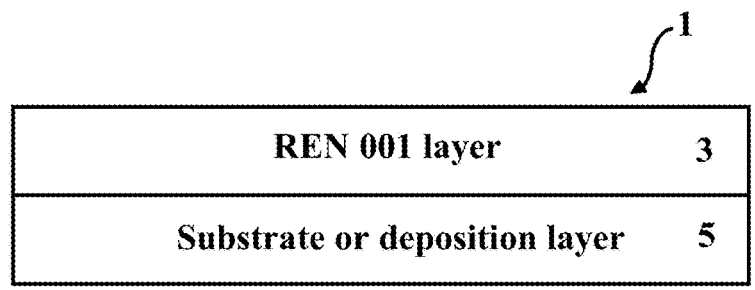
FIG. 1A schematically shows an exemplary structure or device according to one aspect of the present disclosure.

FIG. 1A schematically shows an exemplary structure or device 1 according to one embodiment. The structure or device 1 includes a rare earth nitride (REN) material epitaxial layer 3, and a hexagonal layer 5 or substrate 5. The REN layer 3 is a fully (001)-oriented rare earth nitride epitaxial layer located on the hexagonal layer or substrate 5. (001) represents the crystallographic orientation as defined by Miller indices.

The (001)-oriented rare earth nitride epitaxial layer 3 is in direct contact with a hexagonal surface of the hexagonal layer or substrate 5. The layer 3 is epitaxial with the hexagonal layer or substrate 5.

The hexagonal substrate 5 can be, for example, a GaN substrate. The hexagonal layer 5 can be, for example, an AlN or GaN layer or part of a template structure T (see, for example, FIG. 1E) comprising or consisting of a deposition layer 5 located or deposited on a substrate 5b, for example, a AlN or GaN layer 5 on a silicon substrate 5b.

The hexagonal layer or hexagonal substrate 5 is, for example, a hexagonal crystal layer or hexagonal crystal substrate 5. The hexagonal layer or hexagonal substrate 5 is part of the hexagonal crystal family.

The hexagonal layer or hexagonal substrate 5 has a hexagonal net with a six-fold symmetry, as described for example in the article M. Grundmann, Phys. Status Solidi B, 248, 382805-824 (2011), which is fully incorporated herein by reference.

The hexagonal layer 5 is a (0001)-oriented layer or the hexagonal crystal substrate 5 is a (0001)-oriented hexagonal substrate. (0001) represents the crystallographic orientation as defined by the Bravais-Miller system of indices.

The hexagonal layer or hexagonal substrate 5 preferably has a hexagonal wurtzite structure. The hexagonal layer or substrate 5 can be, for example, a hexagonal group III-nitride layer or substrate. The hexagonal layer 5 or the hexagonal substrate 5 includes or consists of, for example, GaN, AlN, InN, or any alloys thereof, or $Al_2O_3$, or ZnO, or $Zn_xMg_{1-x}O$ with x ranging from 1 to 0.4.

Alternatively, the layer or substrate 5 is a cubic crystal layer oriented along a (111) direction or a cubic crystal substrate oriented along a (111) direction, and the REN layer 3 (for example, a fully (001)-oriented rare earth nitride epitaxial layer) is located on the cubic crystal layer oriented along the (111) direction or the cubic crystal substrate oriented along the (111) direction. The cubic substrate or layer oriented along the (111) direction comprises or consists solely of, for example, MgO; YSZ; $ZrO_2$; $Y_2O_3$; Cu,PbTe; or PbSe.

The REN epitaxial film 3 is fully (001)-oriented. That is, the (001) direction of the FCC structure of the REN layer 3 is perpendicular or substantially perpendicular to the surface of the hexagonal layer or substrate 5.

The (001)-oriented rare earth nitride epitaxial layer 3 is a fully (001)-oriented rare earth nitride epitaxial layer and consists solely of a (001) oriented epitaxial layer. The (001)-oriented rare earth nitride epitaxial layer 3 can consist solely of a (001) oriented epitaxial layer from the contact surface of the hexagonal layer or substrate 5 right through the REN layer 3. The first monolayers of the REN layer 3 are (001) oriented as is the entire thickness of the REN layer 3. The REN layer 3 is a (001) oriented epitaxial layer no matter what the thickness of the layer is.

Alternatively, the (001)-oriented rare earth nitride epitaxial layer 3 is not a fully (001)-oriented rare earth nitride epitaxial layer but instead the REN epitaxial film or layer 3 can comprise or consist solely of both a (111)-oriented film(s) or (sub)layer(s) and a (001)-oriented film(s) or (sub) layer(s). A portion or portions of the layer 3 includes or consists solely of a (001) oriented monolayer or monolayers and a portion or portions of the layer 3 includes or consists solely of a (111) oriented monolayer or monolayers. The entire thickness of the REN layer 3 is made up of (001) oriented monolayers or sublayers and (111) oriented monolayers or sublayers. These layers can for example form multiple successive layers. The growth conditions of the structure 1 can be changed in order to determine the desired orientation of the REN layer 3 as detailed further below.

Alternatively, The REN epitaxial film 3 can be fully (111)-oriented, that is, the (111) direction of the FCC structure of the REN layer is perpendicular to the surface of the substrate. The growth conditions of the structure 1 can be changed in order to determine the desired orientation of the REN layer 3 as detailed further below.

A (111) orientation means that the crystal structure is made of, in a cross-sectional view, an atomic layer of the rare earth element then an atomic layer of N, then an atomic layer of Sm and so on.

A (001) orientation means that that the crystal structure is made of, in a cross-section view, similar atomic layers with the same number of rare earth and N atoms that is repeated through the film.

Figure 1B:
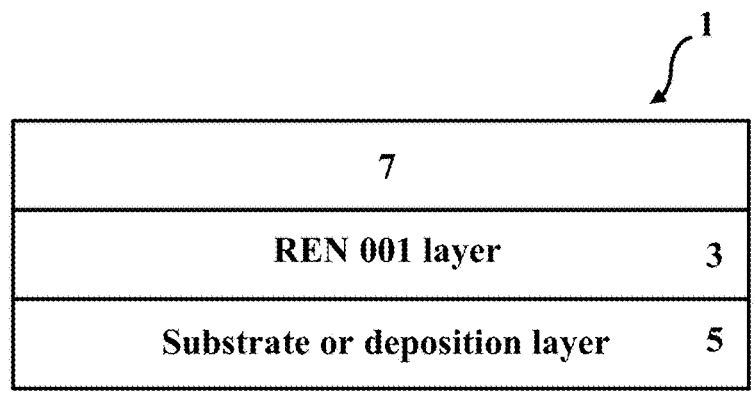
FIG. 1B schematically shows an exemplary structure or device according to another aspect of the present disclosure.

The structure or device 1 may further include one or more epitaxial layers or non-epitaxial layers 7 (as for example illustrated in FIG. 1B).

The one or more epitaxial layers 7 can be a non-rare earth nitride epitaxial layer or layers or a rare earth nitride epitaxial layer or layers; or both non-rare earth nitride epitaxial layer or layers and a rare earth nitride epitaxial layer or layers, for example, forming multiple successive layers.

Figure 1C:
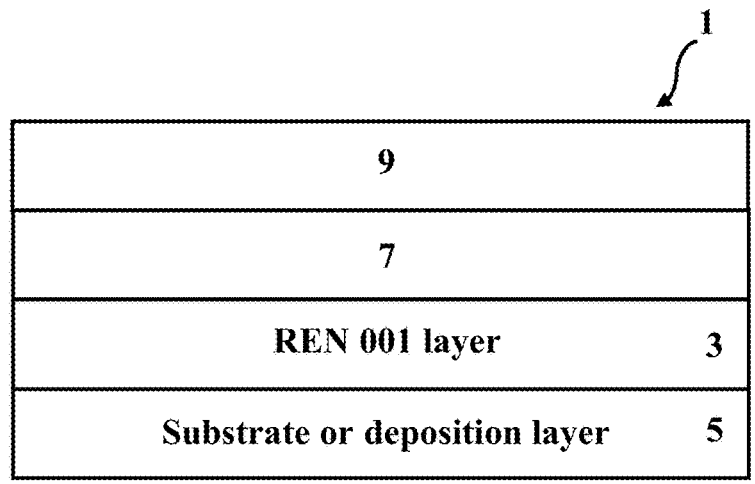
FIG. 1C schematically shows an exemplary structure or device according to further aspect of the present disclosure.

For example, the one or more epitaxial layers 7 could be a (111)-oriented rare earth nitride epitaxial layer or layers 7 which is preferably fully (111)-oriented. The (111)-oriented rare earth nitride epitaxial layer or layers 7 could be located on the (001)-oriented rare earth nitride epitaxial layer 3 (that is to be understood herein as being the fully (001)-oriented rare earth nitride epitaxial layer 3 or the non-fully (001)-oriented rare earth nitride epitaxial layer 3 mentioned above). The (111)-oriented rare earth nitride epitaxial layer or layers 7 can be directly in contact with the (001)-oriented rare earth nitride epitaxial layer 3. The structure or device 1 may further include one or more group III-nitride epitaxial layers 9 (FIG. 1C) on the (111)-oriented rare earth nitride epitaxial layer 7. The one or more group III-nitride epitaxial layers 9 can be in direct contact with the (111)-oriented rare earth nitride epitaxial layer 7.

The structure or device 1 may include layers or a region defining a superlattice, or one or multiple heterostructures. For example, the structure or device 1 may include one or more layers or depositions of different materials defining a superlattice or a heterostructure which may or may not include rare earth nitrides. The superlattice or heterostructure may for example form an optical or electrical active region or device. The epitaxial layer 3 and the layer or layers 7 may form a heterostructure, or a plurality of the layers 7 may form one or more heterostructures or superlattice.

The REN layer 3 may form a layer of an optical or electrical active region or device. The structure or device 1 may additionally or alternatively include layers or material defining an optical or electrical active region or device located on or in direct contact with the REN layer 3.

For example, the structure or device 1 can be a spin-light emitting diode (LED), where the LED active part or region 7 can be, for example, GaN-based and the spin injection region can be made from the REN layer 3, for example, a samarium nitride layer or include samarium nitride. The LED active part or region 7 (that may include one or more layers) is for example present on top of the spin injection region 3 or may be in direct contact with the spin injection region 3.

Figure 1D:
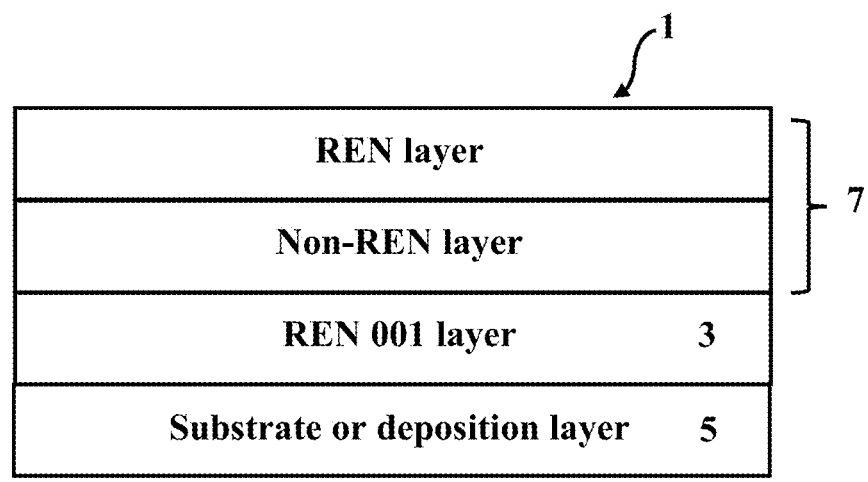
FIG. 1D schematically shows an exemplary structure or device according to another aspect of the present disclosure.

Alternatively, as shown for example in FIG. 1D, the structure or device 1 can be or include a trilayer superlattice comprising or consisting of a REN material or layer(s)/a non-REN material or layer(s)/a REN material or layer(s). Such a trilayer superlattice forms, for example, a Josephson junction or magnetic tunnel junction. The REN (001)-oriented layer 3 is not necessarily part of this trilayer superlattice and this trilayer superlattice may include a different REN layer or material located on the REN (001)-oriented layer 3 and that forms the trilayer superlattice.

The structure or device 1 may include a capping 11 for passivating the rare earth nitride epitaxial layer 3 (for example, the layer 7 of FIG. 1B is a passivating capping) or an outer rare earth nitride epitaxial layer 7 located upon the (001)-oriented rare earth nitride epitaxial layer 3. The capping 11 can be a capping layer deposited on the rare earth nitride material.

The capping 11 can, for example, be or include W, Cr, Cu, TaN, NbN or insulator films such as yttria stabilized zirconia (YSZ), or GaN, AlN or MgF.

The capping 11 can be a removable capping, for example, removable by evaporation or sublimation under a vacuum, including an ultra-high vacuum.

The removable passivating capping layer 11 includes or consists solely of: samarium, europium, thulium, magnesium, indium, antimony, bismuth, zinc, arsenic, silver, strontium, cadmium, calcium, lead, sodium, or tellurium.

The capping 11 may be epitaxial with doped or un-doped rare earth nitride material. The capping 11 may be polycrystalline, or amorphous with doped or un-doped rare earth nitride material.

The capping or capping layer thickness is preferably between about 1 to 200 nm, for example, between 120 to 150 nm or about 40 to 50 nm. It is preferably as thin as possible but thicknesses greater than 200 nm will also technically work.

The REN material epitaxial layer 3 or any other REN material or layer included in the structure or device 1 can include or solely consist of a rare earth nitride selected from the following group: lanthanum nitride (LaN), cerium nitride (CeN), praseodymium nitride (PrN), neodymium nitride (NdN), samarium nitride (SmN), europium nitride (EuN), gadolinium nitride (GdN), terbium nitride (TbN), dysprosium nitride (DyN), holmium nitride (HoN), erbium nitride (ErN), thulium nitride (TmN), ytterbium nitride (YbN), lutetium nitride (LuN). In other words, the REN material epitaxial layer 3 can include or solely consist of lanthanum nitride (LaN), or cerium nitride (CeN), or praseodymium nitride (PrN), or neodymium nitride (NdN), or samarium nitride (SmN), or europium nitride (EuN), or gadolinium nitride (GdN), or terbium nitride (TbN), or dysprosium nitride (DyN), or holmium nitride (HoN), or erbium nitride (ErN), or thulium nitride (TmN), or ytterbium nitride (YbN), or lutetium nitride (LuN), or any combination of the previously mentioned RENs.

The REN material epitaxial layer 3 or any other REN material or layer included in the structure or device 1 can additionally include a rare earth nitride alloy of any two or more of the rare earth nitrides selected from the following group: lanthanum nitride (LaN), cerium nitride (CeN), praseodymium nitride (PrN), neodymium nitride (NdN), samarium nitride (SmN), europium nitride (EuN), gadolinium nitride (GdN), terbium nitride (TbN), dysprosium nitride (DyN), holmium nitride (HoN), erbium nitride (ErN), thulium nitride (TmN), ytterbium nitride (YbN), lutetium nitride (LuN).

The REN material epitaxial layer 3 or any other REN material or layer included in the structure or device 1 can alternatively include or solely consist of a rare earth nitride alloy of any two or more of the rare earth nitrides selected from the following group: lanthanum nitride (LaN), cerium nitride (CeN), praseodymium nitride (PrN), neodymium nitride (NdN), samarium nitride (SmN), europium nitride (EuN), gadolinium nitride (GdN), terbium nitride (TbN), dysprosium nitride (DyN), holmium nitride (HoN), erbium nitride (ErN), thulium nitride (TmN), ytterbium nitride (YbN), lutetium nitride (LuN).

The rare earth nitride material can be non-doped or doped with chemical elements from column/group II of the periodic table including beryllium, magnesium, calcium, strontium, barium and radium.

The rare earth nitride material can for example be made of one or more successive layers of rare earth nitride layers or alloys.

The rare earth nitride material or the doped-rare earth nitride material is a thin film. The film thickness is typically about 1 to 2000 nm.

Figure 1E:
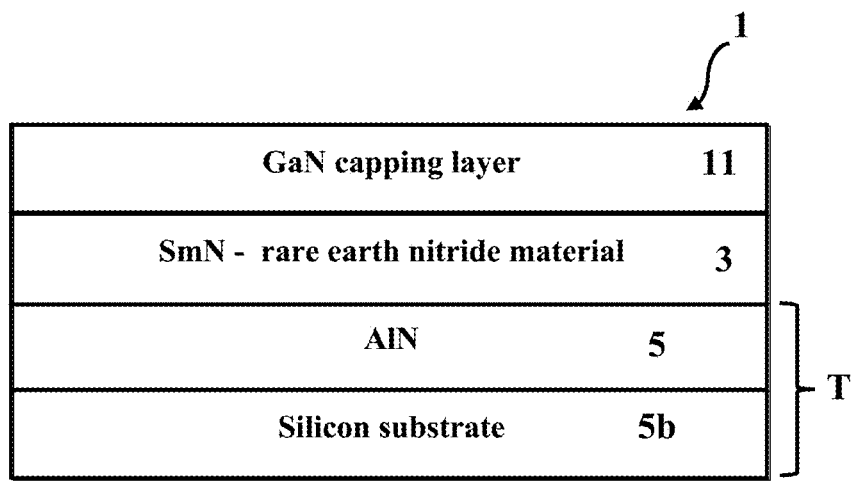
FIG. 1E schematically shows an exemplary structure or device according to further aspect of the present disclosure.
Figure 2A:
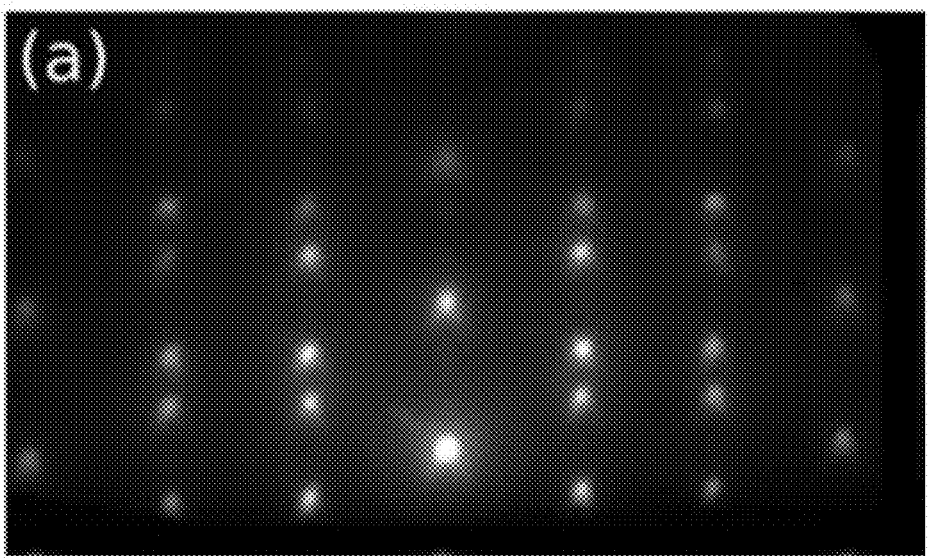
FIG. 2A shows a reflection high energy diffraction (RHEED) pattern of a 100 nm thick SmN layer grown at 700° C. on a hexagonal (0001) AlN template deposited on silicon, the RHEED pattern is taken along the [1-210] azimuth of (0001) AlN.
Figure 2B:
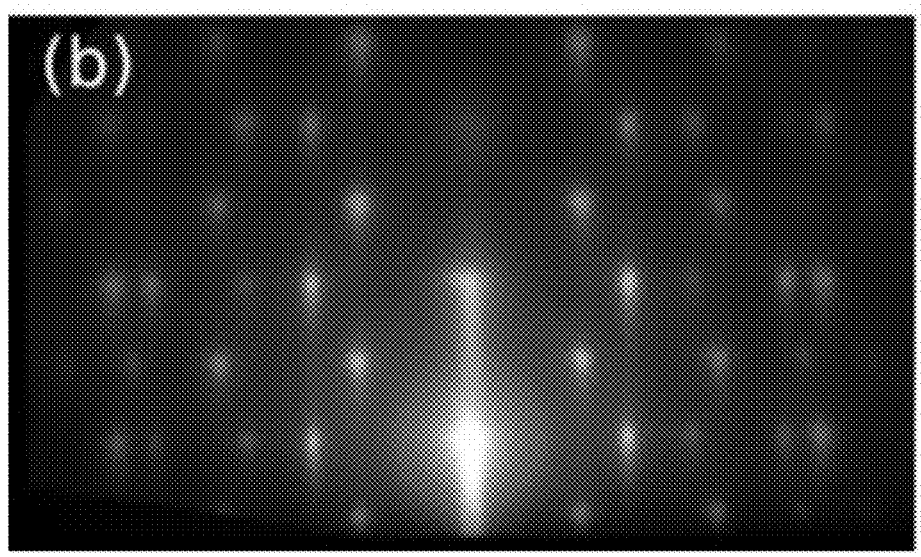
FIG. 2B shows a reflection high energy diffraction (RHEED) pattern of a 100 nm thick SmN layer grown at 800° C. on a hexagonal (0001) AlN template deposited on silicon, the RHEED pattern is taken along the [1-210] azimuth of (0001) AlN.
Figure 2C:
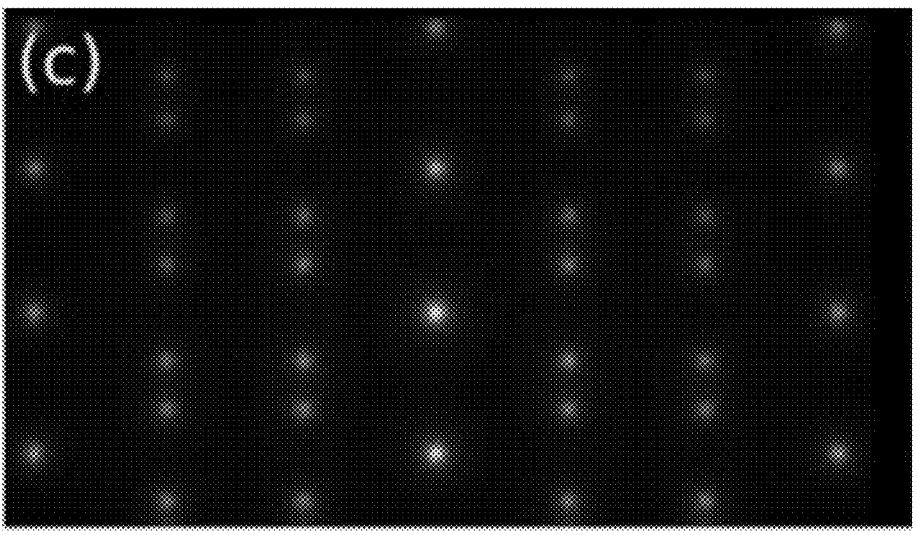
FIG. 2C shows simulation of the respective RHEED pattern from a fully (111) oriented SmN film.
Figure 2D:
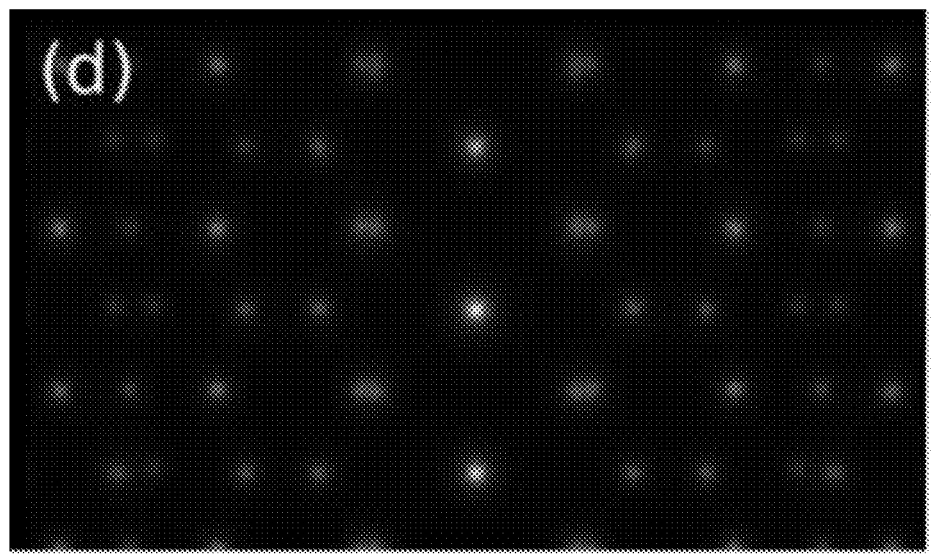
FIG. 2D shows simulation of the respective RHEED pattern from a fully (001) oriented SmN film.

FIG. 1E schematically shows one exemplary structure or device 1 including the rare earth nitride material 3 and a capping 11 for passivating the rare earth nitride material 3. In the specific example of FIG. 1E, the rare earth nitride material 3 is SmN, and the passivating capping 11 is a GaN capping. This structure or device 1 further includes the template T comprising a substrate 5b that is a (111) silicon substrate and hexagonal (0001)-oriented AlN deposition layer 5 on the silicon substrate. The SmN rare earth nitride material 3 is located on the deposition layer 5 of the template T and in direct contact with the deposition layer 5 of the template T.

As previously mentioned, the template T can be replaced by a sole substrate or layer and the rare earth nitride material 3 is thus alternatively located on or deposited on the sole substrate or layer and in direct contact with this sole substrate or layer.

It should be understood that the above examples are non-limiting examples and that the present invention concerns any structure or device 1 comprising or consisting of the fully (001)-oriented rare earth nitride material 3, or the (001)-oriented rare earth nitride material 3 and (111)-oriented rare earth nitride material 3 with or without a capping layer deposited or formed thereon.

Another aspect of the present disclosure concerns a method for producing the rare earth nitride structure 1 or rare earth nitride device 1. The method includes providing a hexagonal layer or substrate 5, and depositing the rare earth nitride epitaxial layer 3 on the hexagonal layer or substrate 5 at a hexagonal layer or substrate temperature (deposition temperature) above an evaporation or sublimation temperature of the rare earth material being deposited in order to form (i) a rare earth nitride epitaxial layer 3 comprising or consisting solely of (001) oriented rare earth nitride epitaxial (sub)layer or (sub)layers and a (111) oriented rare earth nitride epitaxial (sub)layer or (sub)layers or (ii) a rare earth nitride epitaxial layer 3 comprising or consisting solely of a fully (001) oriented rare earth nitride epitaxial layer.

The rare earth nitride structure 1 or rare earth nitride device 1 is for example grown under vacuum in the production chamber of a molecular beam epitaxy system equipped with evaporation cells for rare earths and an ammonia gas nitrogen precursor for providing the nitrogen for reaction with the rare earth element for growth of rare earth nitride epitaxial layer 3 on the hexagonal layer or substrate 5.

Depositing the rare earth nitride epitaxial layer 3 on the hexagonal layer or substrate 5 at a hexagonal layer or substrate deposition temperature 175° C. to 225° C. above (or greater than) an evaporation or sublimation temperature of the rare earth material being deposited produces a (001)-oriented rare earth nitride epitaxial layer 3 when using an ammonia gas nitrogen precursor with a beam equivalent pressure BEP of the atomic or molecular beam from the ammonia gas nitrogen precursor in the range $10 \times 10^{-5}$ to $1 \times 10^{-5}$ Torr (inclusive of $10 \times 10^{-5}$ and $1 \times 10^{-5}$ Torr), for example $1.9 \times 10^{-5}$ Torr. For example, a fully (001) oriented rare earth nitride epitaxial layer is formed when the deposition of the rare earth nitride epitaxial layer 3 on the hexagonal crystal layer or hexagonal crystal substrate 5 is carried out at a deposition temperature of 215° C. to 250° C. for example 225° C. above an evaporation or sublimation temperature of the rare earth material or element being deposited. A rare earth nitride epitaxial layer 3 including or consisting solely of a (001) oriented rare earth nitride epitaxial sublayer or sublayers and a (111) oriented rare earth nitride epitaxial sublayer or sublayers is formed when the deposition of the rare earth nitride epitaxial layer 3 on the hexagonal crystal layer or hexagonal crystal substrate 5 is carried out at a deposition temperature of 165° C. to 200° C. for example 175° C. above an evaporation or sublimation temperature of the rare earth material being deposited.

The evaporation or sublimation temperature for a given pressure of $10 \times 10^{-5}$ to $1 \times 10^{-5}$ Torr (inclusive of $10 \times 10^{-5}$ and $1 \times 10^{-5}$ Torr), for example at $1.9 \times 10^{-5}$ Torr is: 1400° C. for lanthanum (La), 1380° C. for cerium (Ce), 1150° C. for praseodymium (Pr), 1000° C. neodymium (Nd), 575° C. for samarium (Sm), 480° C. for europium (Eu), 1175° C. for gadolinium (Gd), 1150° C. for terbium (Tb), 900° C. for dysprosium (Dy), 950° C. for holmium (Ho), 930° C. for erbium (Er), 680° C. for thulium (Tm), and 1300° C. for lutetium (Lu). For example, epitaxial samarium nitride (SmN) films or layers 3 that are either (a) fully (001) oriented or (b) fully (111) oriented or (c) including both (001) oriented films or sublayers as well as (111) oriented films or sublayers were grown under vacuum in the production chamber of a molecular beam epitaxy system equipped with conventional Sm and Ga evaporation cells.

The purity of the as-received Sm, Ga solid charges was 3N and 7N5. The nitrogen precursor used for the growth of SmN was pure ammonia ($NH_3$) gas. The purity of the $NH_3$ was 6N5.

The growth of the epitaxial SmN and capping with a GaN film was carried out on a 100 nm to 200 nm thick AlN buffer layer 5 (hexagonal (0001)-oriented AlN) grown on a deoxidized silicon substrate 5b oriented along the (111) plane.

Prior to the growth of SmN, the AlN surface is preferably cleaned using a thermal annealing at 880° C. under $NH_3$ for 15 minutes. A number of different SmN layers 3 were grown at a substrate temperature ranging from 300° C. to 800° C. under N-rich conditions, with a beam equivalent pressure (BEP) of $1.9 \times 10^{-5}$ Torr and $1 \times 10^{-7}$ Torr for $NH_3$ and Sm, respectively. The beam equivalent pressure is measured, for example, using a beam flux monitor or gauge RIBER JBA11I (product numbers R302 743 90 D U/M P; M261130). A GRANVILLE-PHILLIPS 350 IONIZATION GAUGE controller is, for example, used. The current used for the flux measurement is 1 mA.

Note that the growth of REN is generally performed under nitrogen-rich conditions in order to limit the formation of nitrogen vacancies.

In-situ RHEED was used to monitor the epitaxial nature of the growth and the RHEED observation of the well-known $(7 \times 7) \leftrightarrow (1 \times 1)$ Si(111) surface phase transition was used to calibrate the temperature measurement by adjusting the emissivity of the optical infrared pyrometer to get a transition at 830° C. The optical infrared pyrometer is used to measure the temperature of the hexagonal layer or substrate 5 at which deposition is to take place. The hexagonal layer or substrate 5 is heated, for example, using a radiant resistive heater.

In-situ scanning tunnelling microscopy (STM) was performed to analyse the SmN surface morphology.

X-ray diffraction (XRD) scans in both symmetric and asymmetric geometries were used to characterise the crystallinity of the SmN layers 3 as well as the heteroepitaxial relationship between the hexagonal oriented AlN layer 5 and SmN epilayer 3. Film growth rates were inferred from ex-situ thickness measurements via cross-section scanning electron microscopy on a freshly cleaved edge of the samples.

The growth rate of the SmN layer 3 is typically about 100 nm/h. The growth rate of the SmN layer can also be lower or higher.

FIG. 1E is a schematic cross-sectional drawing showing the grown structure 1 of an epitaxial layer of SmN 3 on a template T, which comprises an AlN buffer layer 5 deposited on silicon 5b, and with a GaN capping layer 11.

The epitaxial character order/quality of the SmN layer 3 is assessed by reflection high energy diffraction (RHEED) and X-ray diffraction. FIG. 2 shows the reflection high energy diffraction (RHEED) patterns of, for example, a 100 nm thick SmN layer 3 grown at a substrate temperature of 700° C. (FIG. 2A) and 800° C. (FIG. 2B) along the [1-210] azimuth of AlN (0001). The measurements are carried out at ambient temperature.

The RHEED patterns are typically those expected of (FIG. 2A) fully (111) and (FIG. 2B) fully (001) oriented SmN epitaxial layers. Kinematic simulations of the respective RHEED patterns (FIG. 2C) for a fully (111) oriented SmN film and (FIG. 2D) for a fully (001) oriented SmN film show an excellent agreement with experimental results (FIG. 2A) and (FIG. 2B), respectively.

Figure 3:
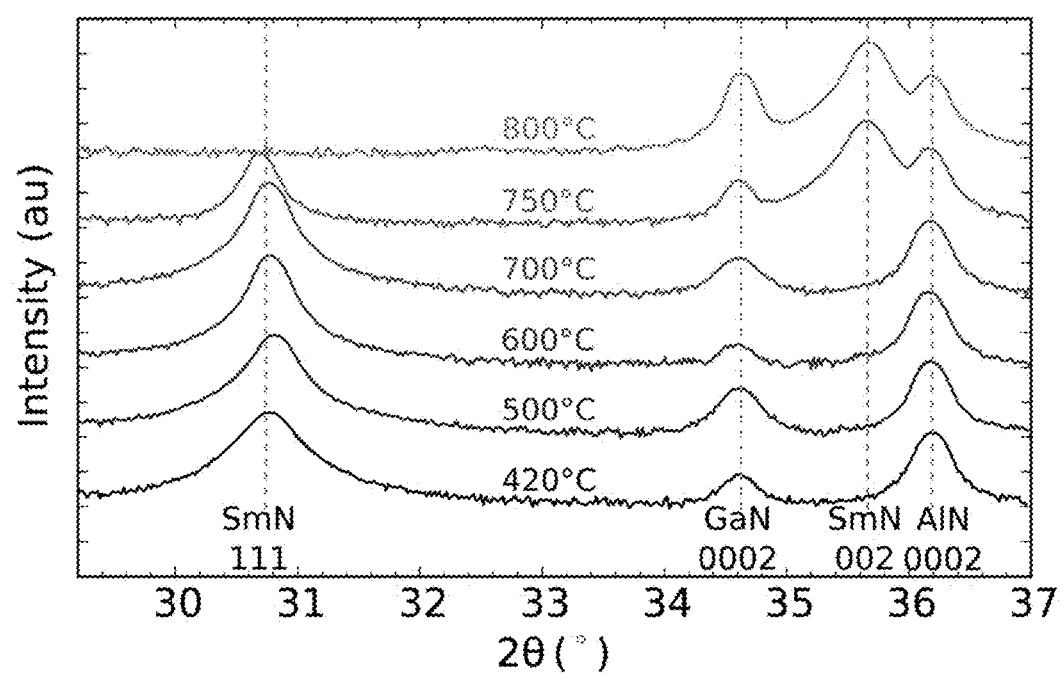
FIG. 3 shows X-ray diffraction omega-2theta scans for the structure presented in FIG. 1a with a SmN thin layer grown at temperatures ranging from 420 to 800° C., an additional GaN capping layer was grown on top of SmN thin layer to avoid reaction of the SmN thin layer with ambient atmosphere during the X-ray measurement.

For XRD measurements, the SmN layers 3 were capped with a 100 nm to 150 nm thick GaN layer 11 in order to prevent decomposition in air. For samples grown at moderate temperatures (hexagonal layer or substrate temperature) up to and including 700° C., only (111)-oriented SmN growth is obtained on top of the AlN (0001) surface in the symmetric 2θ-ω scans (FIG. 3). At higher growth temperatures, a SmN (002) reflection appears indicating the presence of a SmN layer 3 that includes both (001) oriented films or sublayers as well as (111) oriented films or sublayers. Interestingly, the (111) SmN peak intensity in FIG. 3 weakens and then totally disappears for a growth temperature of 800° C. indicating the presence of only (001)-oriented SmN 3 on top of the AlN (0001).

Figure 4:
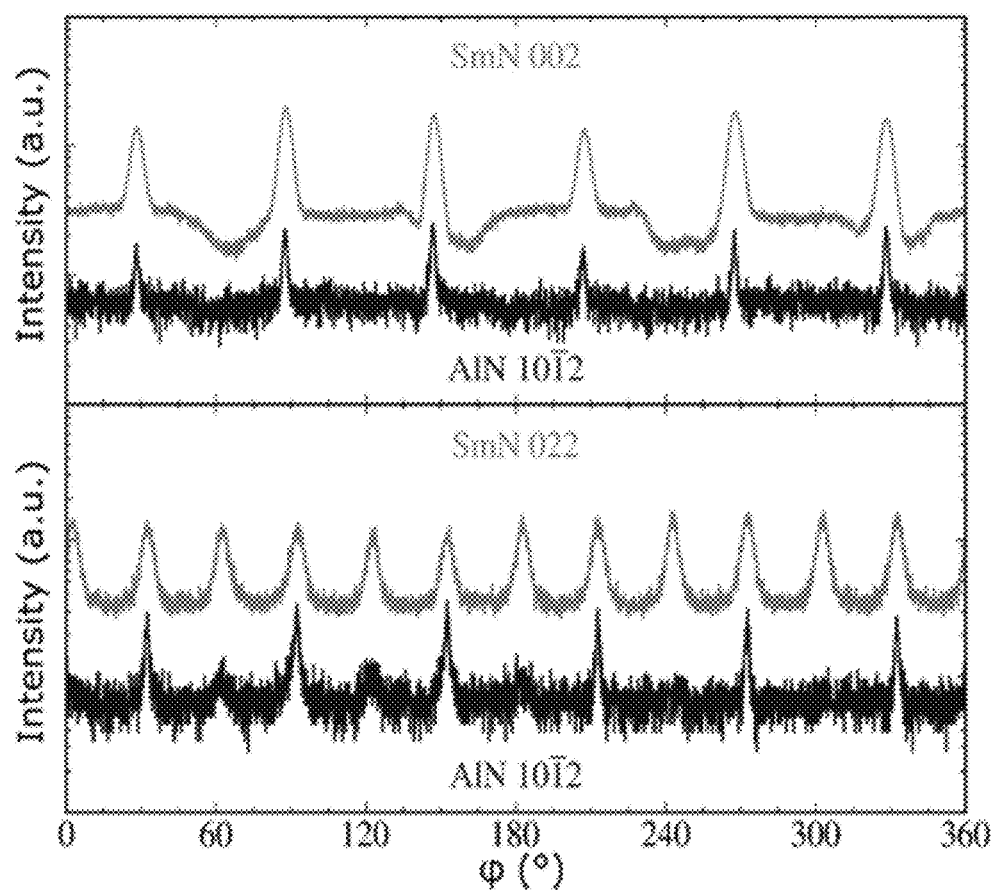
FIG. 4 shows X-ray diffraction asymmetric phi-scan scans of the (002) and (10-12) reflections of the SmN and AlN, respectively, for SmN sample grown at 700° C. (upper) and the (002) and (10-12) reflections of the SmN and AlN, respectively, for SmN sample grown at 800° C. (lower)

In order to further investigate the SmN crystal orientation, asymmetric φ-scans were performed on several samples to identify the epitaxial relationship between the different orientations of SmN 3 grown on AlN 5. FIG. 4 shows the X-ray diffraction asymmetric phi-scan scans of the (002) and (10-12) reflections of the SmN 3 and AlN 5, respectively, for SmN sample grown at 700° C. (upper) and of the (002) and (10-12) reflections of the SmN 3 and AlN 5, respectively, for SmN sample grown at 800° C. (lower). The 6-fold symmetry of the SmN reflection, i.e. the 6 peaks (upper), are characteristic of a fully (111)-oriented SmN layer 3, while the 12-fold symmetry of the SmN reflection, i.e. the 12 peaks (lower), are characteristic of a fully (001)-oriented SmN layer 3.

Advantageously, the fully (001) REN layer could permit to grow on top of it a cubic group-III nitride in which the built-in electric field present in current devices has been removed, and that has a smaller bandgap permitting to much easier reach longer wavelengths.

The SmN lattice constant deduced from XRD measurements at room temperature for all samples average 5.035±0.008 Å using both (111) and (002) reflections, suggesting that all samples are fully relaxed whatever the orientation of the SmN film 3.

The change of crystal orientation may advantageously modify the surface morphology or electrical or optical properties of the rare-earth nitride material.

Figure 5A:
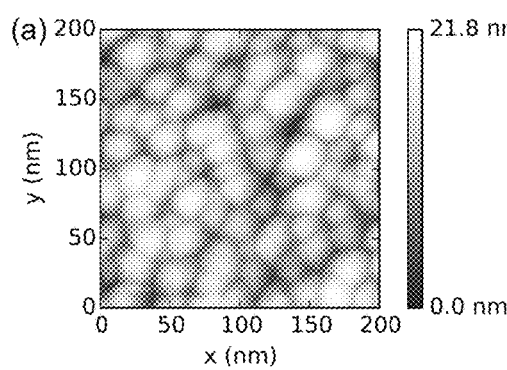
FIG. 5A shows a 200 nm×200 nm scanning tunnelling microscopy (STM) image of the surface of a 100 nm thick SmN layer grown at 700° C. on a hexagonal (0001) AlN template deposited on silicon, where acquisition parameters were 1 nA and 1.5V (sample bias), respectively.
Figure 5B:
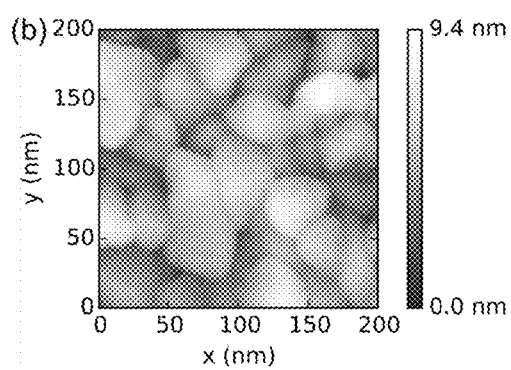
FIG. 5B shows a 200 nm×200 nm scanning tunnelling microscopy (STM) image of the surface of a 100 nm thick SmN layer grown at 800° C. on a hexagonal (0001) AlN template deposited on silicon, where acquisition parameters were 1 nA and 2V (sample bias), respectively.

FIGS. 5A and 5B show 200 nm×200 nm STM images of the surface of a 100 nm thick SmN layer 3 grown at (FIG. 5A) 700° C. and (FIG. 5B) 800° C., respectively.

Acquisition parameters were 1 nA, and 1.5 and 2V (sample biases), respectively. Among the overall morphology difference, two main features can be seen on the images. First, there is a clear decrease in surface roughness when increasing the growth temperature from 700° C. to 800° C.; the fully (001)-oriented SmN with a root mean square (RMS) roughness of 1.46 nm contrasts with the 3.20 nm for the (111)-oriented sample, confirming the previous RHEED observations. Then there is also a clear increase in grain size when increasing the growth temperature from 700° C. to 800° C.; the (001)-oriented SmN, with an average grain size of (33±2) nm compared to (19±2) nm for the (111)-oriented 700° C. sample.

A (001) oriented REN layer having a smoother surface with larger grains is advantageous for most device applications.

Depositing SmN on the hexagonal AlN layer at a deposition temperature 175° C. to 225° C. above the evaporation or sublimation temperature of 575° C. of samarium produces a (001)-oriented rare earth nitride epitaxial layer 3 when using the ammonia gas nitrogen precursor with a beam equivalent pressure BEP of the atomic or molecular beam from the ammonia gas nitrogen precursor in the range $10 \times 10^{-5}$ to $1 \times 10^{-5}$ Torr, for example $1.9 \times 10^{-5}$ Torr. A fully (001) oriented SmN epitaxial layer is formed when the deposition is carried out at a substrate temperature of 225° C. above the evaporation or sublimation temperature of samarium. Both (001) oriented SmN layers and (001) oriented SmN layers are formed when the deposition is carried out at a substrate temperature of 175° C. above the evaporation or sublimation temperature of samarium.

Without wishing to be restricted to any particular theory, the inventors believe that an increased re-evaporation rate of the rare earth element on the substrate and an increased diffusion length occurs at these substrate temperatures above the evaporation or sublimation temperature of the rare earth element and the formation of a (001) oriented REN layer becomes more energetically favored to eventually form a fully (001) oriented REN layer. The above described production method can equally be used to produce structures 1 comprising other the REN materials 3 mentioned previously.

At low substrate temperatures, the formation of a fully (111) oriented REN layer is favored. In such a case, catalytic breakdown can provide the nitrogen for reaction with the rare earth element to form the REN epitaxial layer. At substrate temperatures at or below the evaporation or sublimation temperature of the rare earth material, the formation of a fully (111) oriented REN layer is favored. Depositing the rare earth nitride epitaxial layer 3 on the hexagonal layer or substrate 5 at a hexagonal layer or substrate deposition temperature of less than or equal to an evaporation or sublimation temperature of the rare earth material or element allows to produce a fully (111)-oriented rare earth nitride epitaxial layer 3 for a beam equivalent pressure BEP of the atomic or molecular beam from an ammonia gas nitrogen precursor in the range $10 \times 10^{-5}$ to $1 \times 10^{-5}$ Torr (inclusive of $10 \times 10^{-5}$ and $1 \times 10^{-5}$ Torr), for example $1.9 \times 10^{-5}$ Torr. For cerium (Ce) and ytterbium (Yb), the formation of a fully (111) oriented REN layer can be produced at the layer or substrate deposition temperature less than or equal to the evaporation or sublimation temperature of the concerned rare earth material but at a temperature of the layer or substrate of 500° C. or more to assure thermal cracking of the $NH_3$.

The rare earth nitride material 3, and the optional capping layer 11, can be deposited using ultra-high vacuum techniques known to those skilled in the art. Suitable techniques include, but are not limited to, physical vapour deposition (PVD), including pulsed laser deposition (PLD) and DC/RF magnetron sputtering, molecular beam epitaxy (MBE), and chemical vapor deposition (CVD). Such techniques, known to a skilled person in the art, can equally be used to produce the additional constituent layers of the structures or devices 1 mentioned previously and illustrated for example in FIG. 1.

Alternative nitrogen sources for the REN layer growth can be used and include pure molecular nitrogen or a source of active nitrogen, such as a nitrogen plasma or ionized nitrogen. The crossover to fully (001)-oriented SmN when using one of these alternative nitrogen sources is expected to happen at a different temperature to that of ammonia gas. For example, for a nitrogen source that is pure molecular nitrogen, the growth of a samarium nitride epitaxial layer on the hexagonal crystal layer or hexagonal crystal substrate carried out at a substrate temperature of less than or equal to 500° C. using pure molecular nitrogen as nitrogen precursor results in a fully (111)-oriented rare earth nitride epitaxial layer. The growth of a samarium nitride epitaxial layer on the hexagonal crystal layer or hexagonal crystal substrate carried out at a substrate temperature of 600° C. using pure molecular nitrogen as the nitrogen precursor results in a (001)-oriented rare earth nitride epitaxial layer, that is, a rare earth nitride epitaxial layer 3 comprising or consisting solely of a (001) oriented rare earth nitride epitaxial sublayer or sublayers and a (111) oriented rare earth nitride epitaxial sublayer or sublayers.

It is also noted that a decrease of the beam equivalent pressure of the nitrogen precursor is likely to decrease the temperature at which the crossover from fully (111)- to (001)-oriented happens.

According to an aspect of the present disclosure, the rare earth nitride epitaxial layer 3 can be deposited on the hexagonal layer or substrate 5 at a layer or substrate deposition temperature that is 75° C., or 100° C., or 120° C., or 150° C., or 200° C., or 220° C., or 225° C. or 250° C. above an evaporation or sublimation temperature of the rare earth material to produce a fully (001)-oriented rare earth nitride epitaxial layer 3 for a beam equivalent pressure BEP of the atomic or molecular beam from an ammonia gas nitrogen precursor in the range $10\times10^{-5}$ to $1\times10^{-5}$ Torr (inclusive of $10\times10^{-5}$ and $1\times10^{-5}$ Torr), for example $1.9\times10^{-5}$ Torr.

According to an aspect of the present disclosure, the rare earth nitride epitaxial layer 3 can be deposited on the hexagonal layer or substrate 5 at a layer or substrate deposition temperature that has a value in the range (inclusive of range end values) 75° C. to 250° C., or 100° C. to 250° C., or 120° C. to 250° C., or 150° C. to 250° C., or 200° C. to 250° C., or 220° C. to 250° C. or 225° C. to 250° C., or 75° C. to 225° C., or 100° C. to 225° C., or 120° C. to 225° C., or 150° C. to 225° C., or 200° C. to 225° C., or 75° C. to 220° C., or 100° C. to 220° C., or 120° C. to 220° C., or 150° C. to 220° C., or 200° C. to 220° C., or 75° C. to 200° C., or 100° C. to 200° C., or 120° C. to 200° C., or 150° C. to 200° C., or 75° C. to 150° C., or 100° C. to 150° C., or 120° C. to 150° C., or 75° C. to 120° C., or 100° C. to 120° C. or 75° C. to 100° C., that value being above an evaporation or sublimation temperature of the rare earth material to produce a fully (001)-oriented rare earth nitride epitaxial layer 3 for a beam equivalent pressure BEP of the atomic or molecular beam from an ammonia gas nitrogen precursor in the range $10\times10^{-5}$ to $1\times10^{-5}$ Torr (inclusive of $10\times10^{-5}$ and $1\times10^{-5}$ Torr), for example $1.9\times10^{-5}$ Torr.

While the invention has been disclosed with reference to certain preferred embodiments, numerous modifications, alterations, and changes to the described embodiments, and equivalents thereof, are possible without departing from the sphere and scope of the invention. Accordingly, it is intended that the invention not be limited to the described embodiments, and be given the broadest reasonable interpretation in accordance with the language of the appended claims.

The invention claimed is:

1. A device comprising:
 a hexagonal crystal layer or a hexagonal crystal substrate, and
 a (001)-oriented rare earth nitride epitaxial layer in direct contact with a hexagonal crystal surface on the hexagonal crystal layer or the hexagonal crystal substrate.

2. The device according to claim 1, wherein the hexagonal crystal layer or hexagonal crystal substrate has a hexagonal net with a six-fold symmetry.

3. The device according to claim 1, wherein the hexagonal crystal layer or hexagonal crystal substrate has a hexagonal wurtzite structure.

4. The device according to claim 1, wherein the hexagonal crystal layer is a hexagonal group III-nitride crystal layer or the hexagonal crystal substrate is a group III-nitride hexagonal crystal substrate.

5. The device according to claim 1, wherein the (001)-oriented rare earth nitride epitaxial layer is a fully (001) oriented epitaxial layer.

6. The device according to claim 1, wherein the (001)-oriented rare earth nitride epitaxial layer consists solely of a fully (001) oriented epitaxial layer.

7. The device according to claim 1, further including a (111)-oriented rare earth nitride epitaxial layer.

8. The device according to claim 7, wherein the (111)-oriented rare earth nitride epitaxial layer is located on the (001)-oriented rare earth nitride epitaxial layer.

9. The device according to claim 8, further including at least one group III-nitride epitaxial layer on the (111)-oriented rare earth nitride epitaxial layer.

10. The device according to claim 1, further including a capping for passivating the rare earth nitride epitaxial layer.

11. The device according to claim 1, wherein the rare earth nitride epitaxial layer includes or consists of a rare earth nitride selected from the following group: lanthanum nitride (LaN), cerium nitride (CeN), praseodymium nitride (PrN), neodymium nitride (NdN), samarium nitride (SmN), europium nitride (EuN), gadolinium nitride (GdN), terbium nitride (TbN), dysprosium nitride (DyN), holmium nitride (HoN), erbium nitride (ErN), thulium nitride (TmN), ytterbium nitride (YbN), lutetium nitride (LuN).

12. The device according to claim 1, wherein the rare earth nitride epitaxial layer includes or consists of a rare earth nitride alloy of any two or more of the rare earth nitrides selected from the following group: lanthanum nitride (LaN), cerium nitride (CeN), praseodymium nitride (PrN), neodymium nitride (NdN), samarium nitride (SmN), europium nitride (EuN), gadolinium nitride (GdN), terbium nitride (TbN), dysprosium nitride (DyN), holmium nitride (HoN), erbium nitride (ErN), thulium nitride (TmN), ytterbium nitride (YbN), lutetium nitride (LuN).

13. The device according to claim 1, wherein the rare earth nitride epitaxial layer is doped with at least one element that is beryllium, magnesium, calcium, strontium, barium or radium.

14. The device according to claim 1, further including at least one additional rare earth nitride epitaxial layer or multiple successive rare earth nitride epitaxial layers, the at least one additional rare earth nitride epitaxial layer or multiple successive rare earth nitride epitaxial layers comprising or consisting of a rare earth nitride and/or an alloy of rare earth nitrides.

15. The device according to claim 1, wherein the hexagonal crystal layer is a (0001)-oriented layer or the hexagonal crystal substrate is a (0001)-oriented hexagonal substrate.

16. The device according to claim 1, wherein the hexagonal crystal layer or the hexagonal crystal substrate includes or consists of GaN, AlN, InN, or any alloys thereof, or $Al_2O_3$, or ZnO, or $Zn_xMg_{1-x}O$ with x ranging from 1 to 0.4.

17. The device according to claim 1, wherein the hexagonal crystal layer or hexagonal crystal substrate is AlN and the (001)-oriented rare earth nitride epitaxial layer is SmN.

18. The device according to claim 1, wherein the (001)-oriented rare earth nitride epitaxial layer has a rocksalt crystallographic structure.

19. The device according to claim 1, further including at least one additional optical or electrical active hexagonal crystal layer located between the hexagonal crystal layer or hexagonal crystal substrate and the (001)-oriented rare earth nitride epitaxial layer; or at least one additional optical or electrical active layer located on the (001)-oriented rare earth nitride epitaxial layer.

20. The device according to claim 19, wherein the at least one additional optical or electrical active layer is located on the (001)-oriented rare earth nitride epitaxial layer and is a group III-nitride layer.

21. A method for producing a rare earth nitride structure or rare earth nitride device, the method including the steps of:
  providing a hexagonal crystal layer or a hexagonal crystal substrate; and
  depositing a rare earth nitride epitaxial layer on the hexagonal crystal layer or hexagonal crystal substrate at a substrate deposition temperature 175° C. to 225° C. above an evaporation or sublimation temperature of the rare earth material to form a (001) oriented rare earth nitride epitaxial layer,
  wherein the step of depositing the rare earth nitride epitaxial layer on the hexagonal crystal layer or hexagonal crystal substrate is carried out at a beam equivalent pressure (BEP) of an atomic or molecular beam from an ammonia gas nitrogen precursor that has a value in the range $10 \times 10^{-5}$ to $1 \times 10^{-5}$ Torr.

22. The method according to claim 21, wherein the step of depositing a rare earth nitride epitaxial layer on the hexagonal crystal layer or hexagonal crystal substrate is carried out at a deposition temperature of 225° C. above an evaporation or sublimation temperature of the rare earth material to form a fully (001) oriented rare earth nitride epitaxial layer.

23. A device comprising:
  a cubic crystal layer oriented along a (111) direction or a cubic crystal substrate oriented along a (111) direction, and
  a (001)-oriented rare earth nitride epitaxial layer in direct contact with the cubic crystal layer oriented along the (111) direction or the cubic crystal substrate oriented along the (111) direction.

24. The device according to claim 23, wherein the cubic crystal substrate or layer oriented along the (111) direction is comprises or consists solely of MgO; YSZ; $ZrO_2$; $Y_2O_3$; Cu,PbTe; or PbSe.

* * * * *